United States Patent
Takeda (10) Patent No.: US 10,567,617 B2
(45) Date of Patent: Feb. 18, 2020

(54) IMAGE PROCESSING APPARATUS, METHOD, AND STORAGE MEDIUM, THAT PERFORM DITHER PROCESSING ON FIRST IMAGE DATA TO GENERATE SECOND IMAGE DATA HAVING PIXELS OF VARYING DENSITY

(71) Applicant: CANON KABUSHIKI KAISHA, Tokyo (JP)

(72) Inventor: Shoji Takeda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/919,327

(22) Filed: Mar. 13, 2018

(65) Prior Publication Data

US 2018/0278800 A1    Sep. 27, 2018

(30) Foreign Application Priority Data

Mar. 27, 2017    (JP) .................................. 2017-061326

(51) Int. Cl.
*H04N 1/40* (2006.01)
*H04N 1/405* (2006.01)
*H03K 9/08* (2006.01)
*H03K 7/08* (2006.01)
*G06T 7/00* (2017.01)

(52) U.S. Cl.
CPC ............. *H04N 1/4056* (2013.01); *H03K 7/08* (2013.01); *H03K 9/08* (2013.01); *G06T 7/0002* (2013.01)

(58) Field of Classification Search
CPC .......... H04N 1/4056; H03K 9/08; H03K 7/08; G06T 7/0002
See application file for complete search history.

(56) References Cited

U.S. PATENT DOCUMENTS

| | | | |
|---|---|---|---|
| 8,892,932 B2 | 11/2014 | Takahashi et al. | |
| 2006/0209109 A1* | 9/2006 | Arazaki | ................. B41J 29/393 347/12 |
| 2009/0034004 A1* | 2/2009 | Nakamura | ........... H04N 1/0473 358/3.03 |

FOREIGN PATENT DOCUMENTS

JP    2000-270218 A    9/2000

* cited by examiner

*Primary Examiner* — Yaovi M Ameh
(74) *Attorney, Agent, or Firm* — Venable LLP (57) ABSTRACT

An image processing apparatus includes (A) a dither processing unit to perform dither processing on first image data to generate second image data, the second image data including a target pixel and an adjacent pixel, each of the pixels having a density value, the density value of the target pixel being greater than that of the adjacent pixel, and the density value of the adjacent pixel being not greater than a predetermined density, (B) a diffusing unit (a) to determine an error value resulting at the target pixel, (b) to diffuse the error value to pixels subsequent to the target pixel, and not to diffuse an error value resulting at the adjacent pixel to pixels subsequent to the adjacent pixel.

9 Claims, 10 Drawing Sheets

| | 801 | | 802 | 803 | 804 |
|---|---|---|---|---|---|
| | β | | PWM VALUE | MEASURED LIGHT AMOUNT | PWM ERROR VALUE |
| | | | 0/40 | 0 | 0 |
| | | | 1/40 | 0 | 0.059887740 |
| | | | 2/40 | 0 | 0.084915091 |
| | | | 3/40 | 0 | 0.109951729 |
| | | | 4/40 | 0 | 0.134986364 |
| | 0 | | 5/40 | 0.064660318 | 0.095346841 |
| | 1 | | 6/40 | 0.187487481 | -0.002459526 |
| | 2 | | 7/40 | 0.207048751 | 0 |
| | 3 | | 8/40 | 0.222529476 | -0.007459929 |
| | 4 | | 9/40 | 0.246367406 | -0.006277064 |
| | 5 | | 10/40 | 0.281047216 | -0.005936078 |
| | 6 | | 11/40 | 0.311092732 | -0.010960798 |
| | 7 | | 12/40 | 0.335376793 | -0.010224063 |
| | 8 | | 13/40 | 0.354868138 | -0.004694613 |
| | 9 | | 14/40 | 0.377666312 | -0.012471991 |
| | 10 | | 15/40 | 0.406164029 | -0.005948912 |
| | 11 | | 16/40 | 0.438449302 | -0.003213390 |
| | 12 | | 17/40 | 0.455125474 | 0.010131234 |
| | 13 | | 18/40 | 0.476315757 | 0.014961747 |
| | 14 | | 19/40 | 0.493720305 | 0.026577994 |
| | 15 | | 20/40 | 0.511070225 | 0.035248870 |
| | | | 21/40 | 0.531127883 | 0.045212007 |
| | | | 22/40 | 0.556398894 | 0.048961792 |
| | | | 23/40 | 0.584293879 | 0.040087603 |
| | | | 24/40 | 0.616162157 | 0.029240121 |
| | | | 25/40 | 0.646278690 | 0.024144383 |
| | | | 26/40 | 0.669896287 | 0.025547582 |
| | | | 27/40 | 0.690305386 | 0.030159278 |
| | | | 28/40 | 0.713766382 | 0.021719078 |
| | | | 29/40 | 0.746583370 | 0.013922886 |
| | | | 30/40 | 0.784453467 | 0.001073585 |
| | | | 31/40 | 0.803547847 | 0 |
| | | | 32/40 | 0.811967876 | -0.046399233 |
| | | | 33/40 | 0.999983612 | -0.139394173 |
| | | | 34/40 | 1 | -0.114389766 |
| | | | 35/40 | 1 | -0.088873674 |
| | | | 36/40 | 1 | -0.063796429 |
| | | | 37/40 | 1 | -0.038680945 |
| | | | 38/40 | 1 | -0.013206735 |
| | | | 39/40 | 1 | 0.011424380 |
| | | | 40/40 | 1 | 0.036581746 |

IMAGE PROCESSING APPARATUS, METHOD, AND STORAGE MEDIUM, THAT PERFORM DITHER PROCESSING ON FIRST IMAGE DATA TO GENERATE SECOND IMAGE DATA HAVING PIXELS OF VARYING DENSITY

CLAIM TO PRIORITY

This application claims the benefit of Japanese Patent Application No. 2017-061326, filed Mar. 27, 2017, which is hereby incorporated by reference wherein in its entirety.

BACKGROUND OF THE INVENTION

Field of the Invention

The present invention relates to an electrophotographic image forming technology of forming an image on a photoreceptor by repeating charging, exposing, and developing.

Description of the Related Art

Conventionally, in an electrophotographic image forming apparatus forming an image on a photoreceptor by repeating charging, exposing, and developing, a method of performing output concentration adjustment by controlling a pulse width of a pulse width modulation (PWM) signal has been widely known. Such an image forming apparatus controls a light amount of laser light emitted from a laser light source according to the narrowness and broadness of the pulse width of the PWM signal, and thus, changes a depth of a latent image (an electrical charge amount) formed on the surface of the photoreceptor. In a case when an electrical charge amount decreases, a toner amount applied onto a printing medium decreases, and, in a case when the electrical charge amount increases, the toner amount applied onto the printing medium increases.

In the output concentration adjustment based on the pulse width of the PWM signal, it is ideal that a correspondence relationship between the pulse width of the PWM signal and a laser light amount is linear in order to obtain an excellent output concentration. However, in a case when the pulse width of the PWM signal is less than a predetermined value, there is a case when the laser light source is not capable of being turned on, whereas in a case when the pulse width of the PWM signal is greater than a predetermined value, there is a case when an interval for turning off the laser light source shortens. As a result thereof, even in a case when a PWM signal of a certain pulse width is output, there is a case when it is not possible to obtain an expected ideal laser light amount. Further, even in a case when the pulse width of the PWM signal is in a predetermined range, there is a case when an error between the laser light amount actually output on the basis of the PWM signal and the expected ideal laser light amount (hereafter, the error will be referred to as a "PWM error") occurs.

A function of correcting a concentration value of input image data is provided in an image forming apparatus described in Japanese Patent Laid-Open No. 2000-270218 in consideration of such properties of the laser light. Specifically, correction of subtracting or adding the concentration value of the input image data is performed with respect to a low concentration region and a high concentration region where On/Off of the laser light source is not capable of being controlled, and the concentration value of the subtracted or added difference is diffused to the peripheral pixels as the error value (error diffusion processing).

SUMMARY OF THE INVENTION

An object of the invention is to obtain an output image of a high image quality by suppressing the occurrence of moire, pseudo contour, or the like, in an output image.

An image processing apparatus of the invention includes an error value calculation unit configured to calculate an error value in a target pixel from a concentration value in the target pixel of input image data, and a PWM error value calculated on the basis of a light amount of laser light which is actually emitted on the basis of a PWM signal of a pulse width corresponding to the concentration value in the target pixel, and a light amount of ideal laser light corresponding to the pulse width, and a concentration value calculation unit configured to add the error value calculated in peripheral pixels positioned in the vicinity of the target pixel to the concentration value in the target pixel at a predetermined ratio, in which the error value calculation unit sets the error value in the target pixel to zero according to the concentration value in the target pixel or a pixel position of the target pixel in the input image.

Further features of the present invention will become apparent from the following description of exemplary embodiments with reference to the attached drawings.

DESCRIPTION OF THE PREFERRED EMBODIMENTS

As with the image processing apparatus described in Japanese Patent Laid-Open No. 2000-270218, in a case when the error diffusion processing of the error value converted from the PWM error is executed, moire, pseudo contour, or the like, may occur in the output image.

Prior to the description of embodiments of the invention, a specific example of processing of performing concentration adjustment with respect to the entire image by diffusing an error value converted from an error between an ideal output concentration and an actual output concentration to peripheral pixels will be described.

(PWM Error)

Figure 1A:
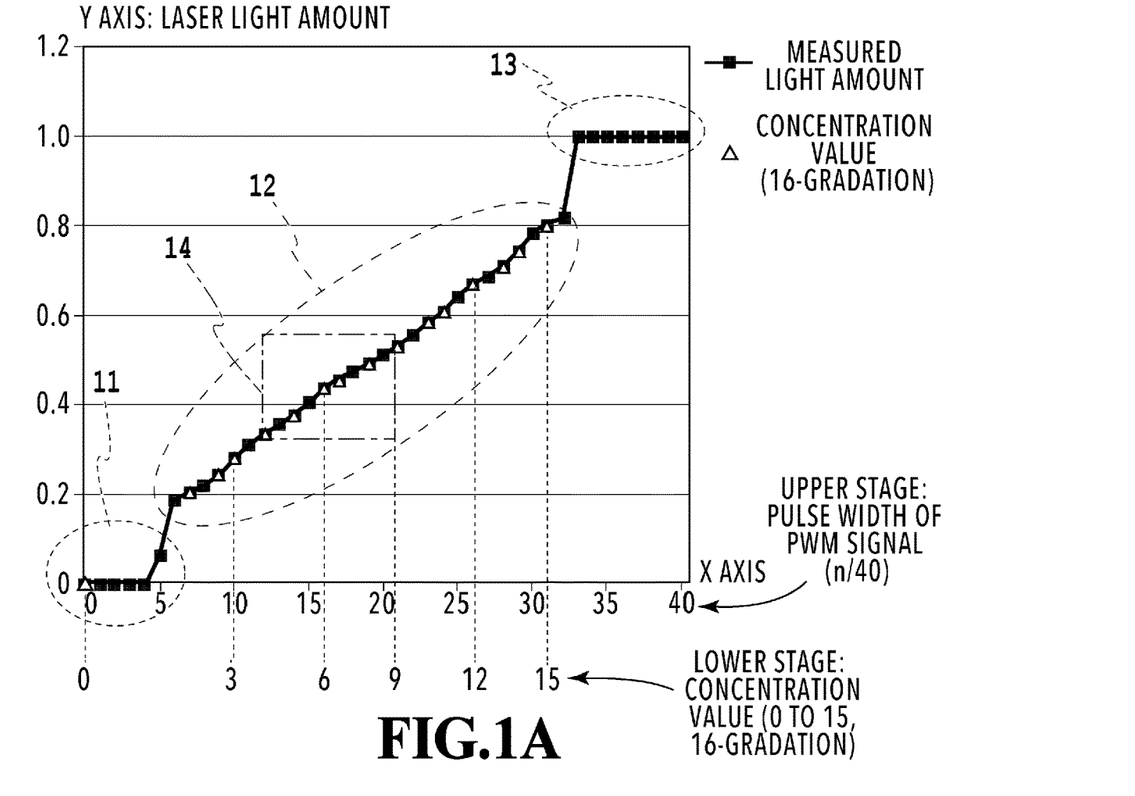
FIG. 1A and FIG. 1B are examples of a graph illustrating properties of a laser light amount in an electrophotographic image forming apparatus.

FIG. 1A is a graph in which an X axis is set to a pulse width of a PWM signal, and a Y axis is set to a laser light amount in an electrophotographic image forming apparatus. In the graph of FIG. 1A, a measured light amount (a black square) indicates a value obtained by measuring a light amount of laser light emitted in a state when PWM signals of the same pulse width are continuously output. In a low pulse width region 11 where a pulse width is 0/40 to 4/40, it is known that the measured light amount is zero or a slight value. This is because, in a case when the pulse width of the PWM signal is less than a predetermined value, the light emitting source is not turned on due to the PWM signal, and the light emission itself of the laser light is not performed. In addition, in an intermediate pulse width region 12 where a pulse width is 5/40 to 32/40, a plotted measured light amount (a black square) is approximately linear. Then, in a high pulse width region 13 where a pulse width is 33/40 to 40/40, a measured light amount is one. This is because, in a case when the pulse width of the PWM signal is greater than a predetermined value, a time interval until the next pulse is turned on shortens, and thus, the light emitting source is not turned off, and the light emission of the laser light is not paused.

According to such properties of the laser light, in most of electrophotographic image forming apparatuses, a concentration value of input image data is converted into a pulse width at which the light emitting source can be turned On/Off, and an image is formed on the basis of a PWM signal of the converted pulse width. In a case when the graph of FIG. 1A is described as an example, and a concentration value (Δ) of the input image data is represented by a 16-gradation of 0 to 15, the concentration values respectively correspond to the pulse widths such that a pulse width 10 is set to a concentration value 3, a pulse width 16 is set to a concentration value 6, and a pulse width 22 is set to a concentration value 9. That is, the image forming apparatus retains a table in which each pulse width (5/40 to 32/40) in the intermediate pulse width region 12 is associated in advance with each concentration value (0 to 15, the 16-gradation), and derives the pulse width of the PWM signal from the concentration value of the input image data.

Figure 1B:
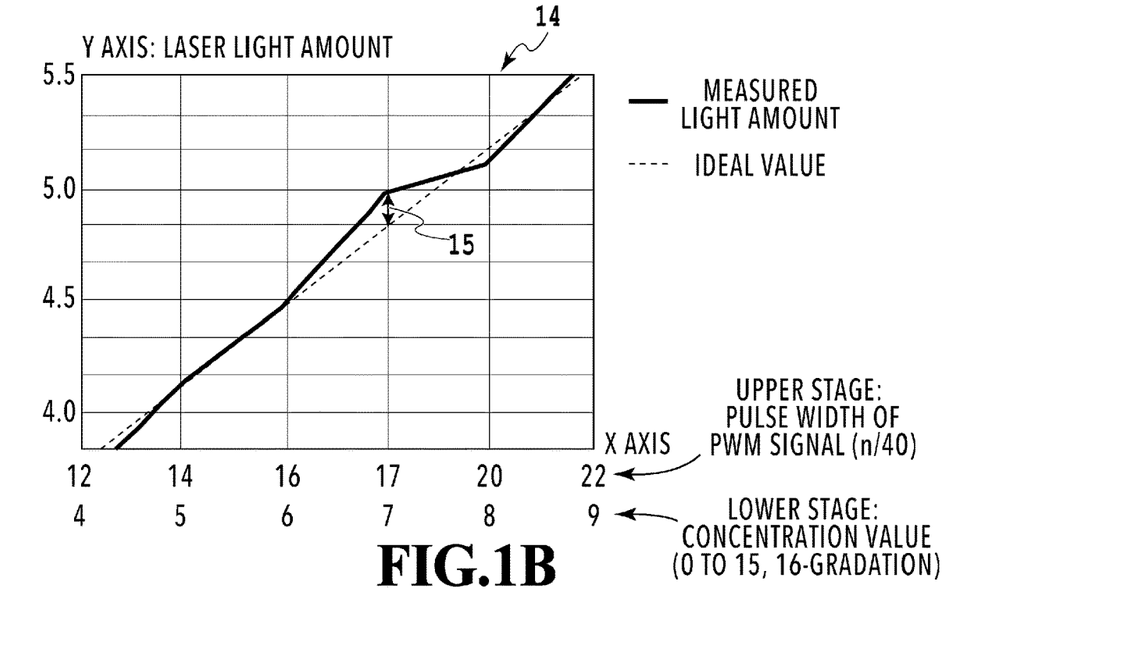

However, the plotted measured light amount (the black square) is not completely linear, and thus, there is a limit in resolution power of the PWM signal that can be output. For this reason, there is a case when a PWM error occurs between an ideal value in a case when the correspondence relationship between the pulse width of the PWM signal and the laser light amount is completely linear, and the actual measured light amount (the black square). FIG. 1B is a diagram in which a region 14 in the graph of FIG. 1A is enlarged. In the graph of FIG. 1B, in the measured light amount corresponding to a concentration value 7 (Pulse Width of PWM Signal=17), a PWM error 15, which is a difference with respect to the ideal value, occurs. According to such a PWM error 15, for example, in a case when a solid image of the concentration value 7 is output, a solid image of a high concentration which is greater than the ideal value is output. In addition, in a region including a gradation at which the concentration value is gradually changed, there is also a possibility that pseudo contour occurs.

(Concentration Adjustment of Error Diffusion)

In order to set an output concentration to be close to the ideal value, a method is proposed in which the error value converted from the PWM error is diffused to peripheral pixels positioned in the vicinity of a target pixel, and the concentration is adjusted over the entire output image.

Figure 2:
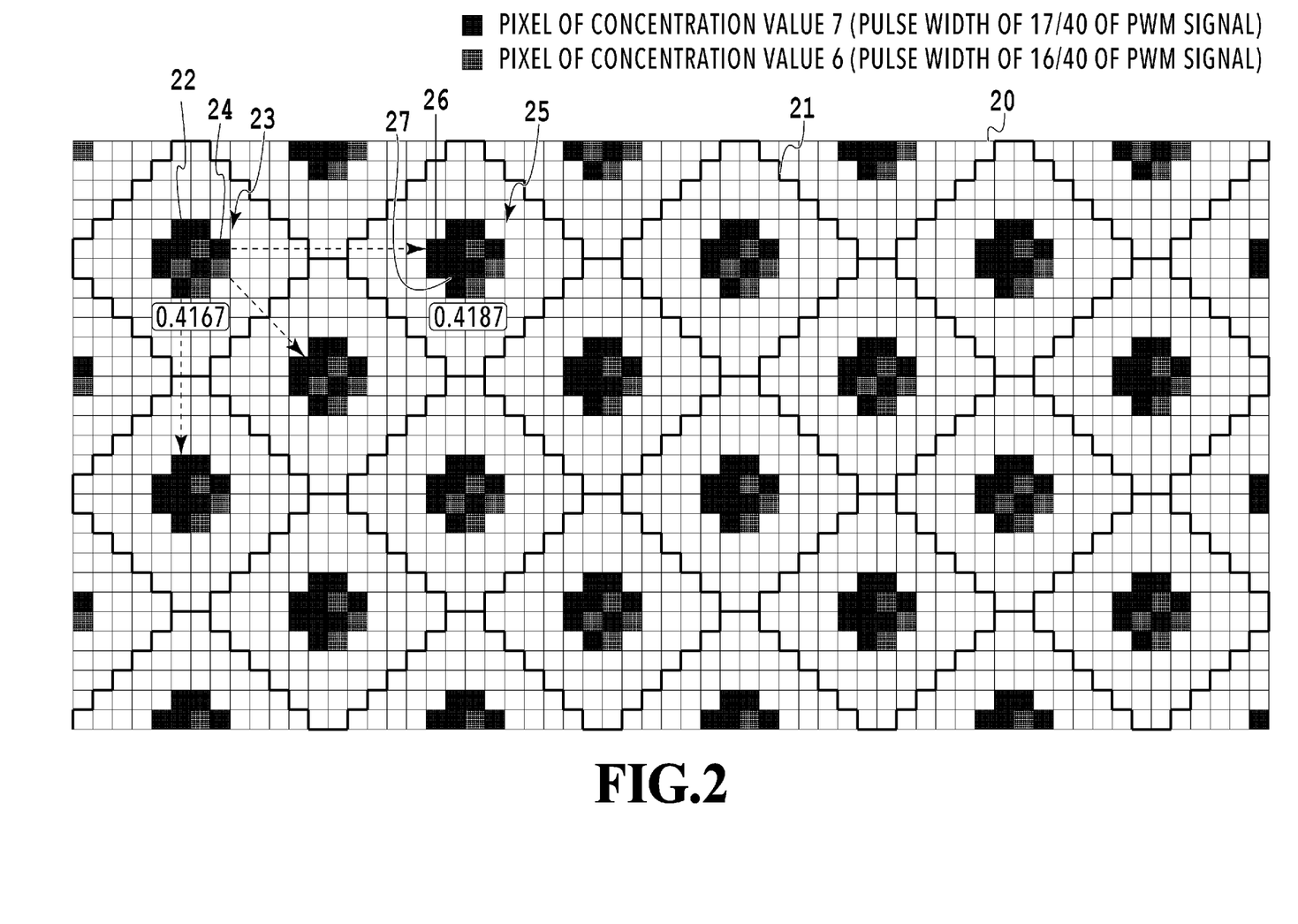
FIG. 2 is a diagram illustrating a specific example of error diffusion processing of an error value that is converted from a PWM error.

FIG. 2 is a diagram illustrating a specific example of the error diffusion processing. In this example, an example will be described in which the error diffusion processing of the error value converted from the PWM error is performed with respect to a screen image subjected to dither screen processing. Here, the dither screen processing indicates processing of performing quantization such that a predetermined screen angle is generated in image data subjected to pre-processing such as color space conversion processing, γ correction processing, and filter processing. Furthermore, in order to generate a screen angle, in two-dimensional arrangement of a dither matrix, quantization processing may be performed by using a dither matrix group arranged to be different from each other in a sub-scanning direction. In general, the dither screen processing is performed such that a different screen angle is generated in each color component of the color image, and thus, it is possible to suppress the occurrence of moire in the output image.

FIG. 2 illustrates a part of a screen image 20 of which a screen angle is 45° and definition is 1200 dpi, as an example. The screen dot group is generated in order to express a contrasting density of the entire image in the screen image 20, and in the example of the screen image 20 of FIG. 2, is composed of twelve pixels. In the screen image 20, a solid line schematically indicates a boundary 21 between regions where the screen dot group exists. Furthermore, in the screen dot group of FIG. 2, a black pixel indicates that the concentration value is 7 (Pulse Width of PWM Signal=17/40), and a gray pixel indicates that the concentration value is 6 (Pulse Width of PWM Signal=16/40). In a case when the target pixel is a pixel 22, an error value converted from the PWM error 15 corresponding to the pulse width of 17/40 is obtained, the obtained error value is delivered to the peripheral pixels of the pixel 22 at a predetermined ratio, and the delivered error value is added to each of the concentration values of the peripheral pixels. The image forming apparatus performs the error diffusion processing by repeating the delivery of the error value for each target pixel while sequentially scanning the target pixels. In the example of FIG. 2, in twelve pixels constituting a screen dot group 23, it is possible to express the output concentration of the pulse width of the PWM signal corresponding to (17×8+16×4)/(40×12)=0.4167 by a combination of Black Pixel×8 and Gray Pixel×4. According to such error diffusion processing, the image forming apparatus is capable of adjust the concentration over the entire output image.

(Problem of Error Diffusion Processing)

However, as illustrated in FIG. 2, in a case when the error diffusion processing of the error value is performed with respect to the screen image, an output concentration different for each screen dot group is calculated, and thus, there is a case when moire or the like occurs in the output image.

In the screen image 20 of FIG. 2, a white pixel indicates that the concentration value is 0 (the pulse width of the PWM signal is 0/0). For this reason, an error value calculated in a certain screen dot group is propagated to the adjacent screen dot group, and thus, there is a case when the calculation of the output concentration is affected. A broken line arrow in the screen image 20 schematically indicates a state in which the error value is propagated to the adjacent screen dot group from each pixel of the screen dot group 23.

In the description with reference to FIG. 2, for example, in a case when the target pixel is a pixel 24, a value at a predetermined ratio in error values calculated with respect to the pixel 24 is propagated to a pixel 26 of the adjacent screen dot group 25. Then, the same error diffusion processing is performed with respect to the screen dot group 25, and thus, for example, the error value is added to a pixel 27, and the pixel 27 is corrected to the black pixel from the gray pixel. As a result thereof, the screen dot group 25 expresses the output concentration of the pulse width of the PWM signal corresponding to $(17\times9+16\times3)/(40\times12)=0.4187$. As illustrated in FIG. 2, the screen dot group expressing Output Concentration=0.4167, and the screen dot group expressing Output Concentration=0.4187 periodically exist together, and thus, there is a case when moire, or the like, occurs in the output image.

Hereafter, a method of solving the problem of the error diffusion processing will be described with reference to the drawings. Here, constituents described in the following embodiments are merely an example, and the scope of the invention is not necessarily limited thereto.

<Configuration of Image Forming Apparatus>

Figure 3:
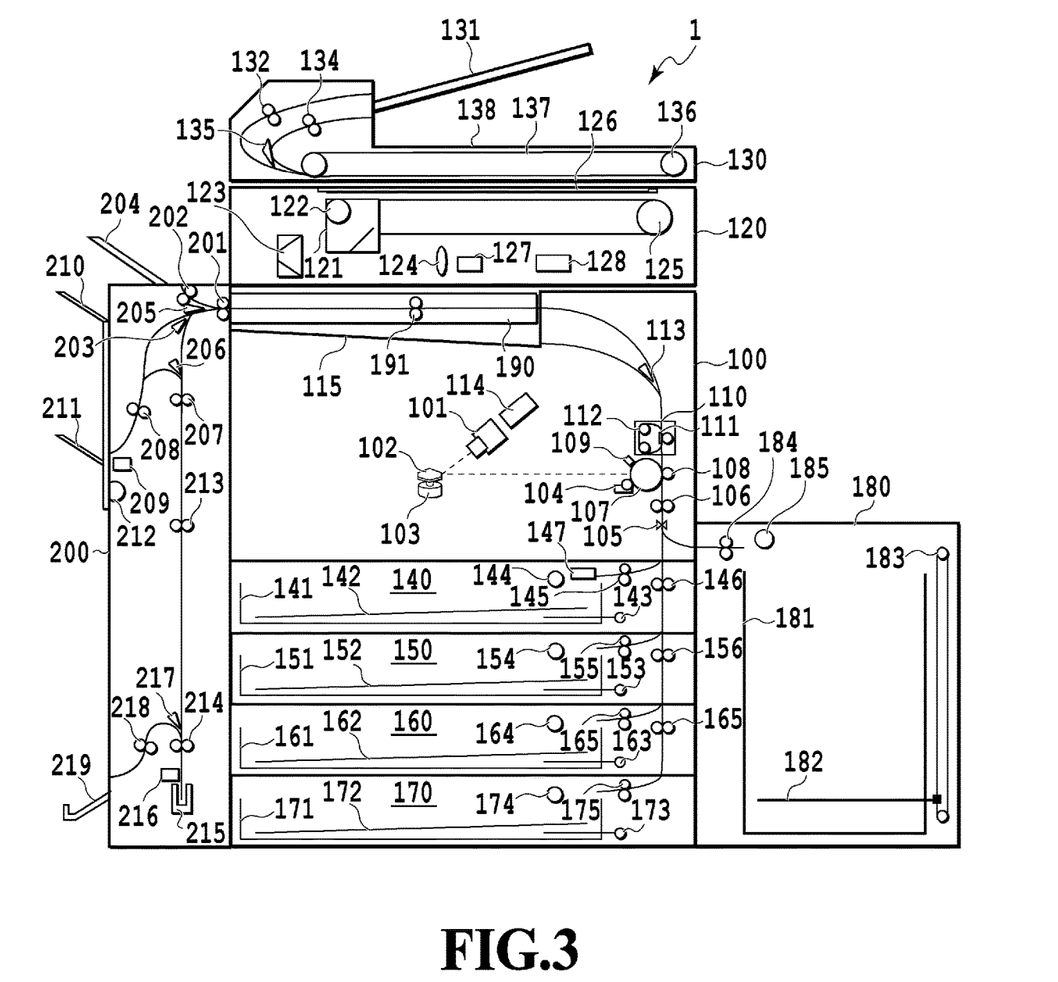
FIG. 3 is a diagram illustrating an example of a configuration of the image forming apparatus.

FIG. 3 is a diagram illustrating an example of a configuration of an image forming apparatus of this embodiment. In this embodiment, the image forming apparatus is a digital copier 1, and in FIG. 3, an example of a main body configuration of the digital copier 1 is illustrated. The digital copier 1 of this embodiment is configured of a document conveying unit 130, a document reading unit 120, an image forming unit 100, a conveyance unit 190, a paper feeding stage (main body paper feeding stages 140, 150, 160, and 170 and a deck paper feeding stage 180), and a post-processing apparatus 200. Hereinafter, the configuration of each unit will be described.

(Document Conveying Unit)

The document conveying unit 130 is configured as follows. A document set on a document platen 131 is conveyed to a document reading position by a paper feeding roller 132 one by one. In the document reading position, the document is disposed in a predetermined position by a document conveying belt 137 which is driven by the motor 136, and the document reading unit 120 reads the disposed document. In a case when the reading of the document is ended, a conveyance route is changed by a flapper 135, and the motor 136 is reversed, and thus, the document is ejected to an ejection tray 138.

(Document Reading Unit)

The document reading unit 120 is configured as follows. An exposure lamp 122 is a fluorescent lamp, a halogen lamp, and the like, and irradiates the document on a document base 126 with light while being moved in a direction perpendicular to a longitudinal direction. Scattering light generated by irradiating the document with light by the exposure lamp 122 is reflected on a first mirror base 121 and a second mirror base 123, and reaches a lens 124. At this time, a movement rate of the second mirror base 123 is ½ with respect to a movement rate of the first mirror base 121, and a distance from a document surface, which is an irradiation object of the exposure lamp 122, to the lens 124 is maintained to be constant. The first mirror base 121 and the second mirror base 123 are moved by a motor 125. An image on the document is formed on a light receiving unit of a CCD line sensor 127, in which several thousands of light receiving elements are arranged in a line, through the first mirror base 121, the second mirror base 123, and the lens 124, and is sequentially subjected to photoelectric conversion in line unit by the CCD line sensor 127. A photoelectric conversion signal is processed by a signal processing unit 128, and then, is output.

(Image Forming Unit)

The image forming unit 100 is configured as follows. An exposure control unit (not illustrated) performs processing according to electrophotographic properties in an image processing unit 114, on the basis of an output image signal of the signal processing unit. The exposure control unit drives a semiconductor laser 101, and irradiates a surface of a photoconductor drum (a photoreceptor) 107, which is rotated at a constant speed, with a light beam. At this time, the exposure control unit performs polarization scanning with a light beam parallel to an axis direction of the photoconductor drum 107, by using a polygon mirror 102 rotated by a motor 103. Furthermore, in the photoconductor drum 107, a residual electrical charge on the photoconductor drum 107 is discharged by an exposure lamp (not illustrated) before the light beam is emitted, and the surface of the photoconductor drum 107 is evenly charged by a primary charging device 109. As a result thereof, the light beam is emitted while the photoconductor drum 107 is rotated, and thus, an electrostatic latent image is formed on the surface of the photoconductor drum 107. Then, a developing device 104 develops the electrostatic latent image formed on the surface of the photoconductor drum 107 by using a developer (a toner) of a predetermined color, and thus, visualizes the electrostatic latent image.

Transfer paper conveyed from the transfer paper feeding stages 140, 150, 160, 170, and 180 described below is conveyed to a resist roller 106. The resist roller 106 detects that the transfer paper has reached as a detection signal is received from a sensor 105, and feeds the transfer paper to a transfer position by matching a reaching timing of a tip end of the toner image formed on the photoconductor drum 107 with a reaching timing of a tip end of the transfer paper. A transfer charging device 108 transfers the toner image developed on the photoconductor drum 107 to the fed transfer paper. In the photoconductor drum 107, a residual toner is removed by a cleaner (not illustrated). The transfer paper onto which the toner image is transferred, is easily separated from the photoconductor drum 107 since the curvature of the photoconductor drum 107 is large, and a voltage is applied to a discharge needle (not illustrated), and thus, an adsorption force between the photoconductor drum 107 and the transfer paper weakens, and the transfer paper is easily separated from the photoconductor drum 107. The transfer paper separated from the photoconductor drum 107 is conveyed to a fixing unit 110, and a toner is fixed onto the transfer paper. The fixing unit 110 is configured of a ceramic heater 111, a film 112, and two rollers, and the heat of the ceramic heater 111 is efficiently transmitted onto the transfer paper through the thin film 112. A direction flapper 113 switches an ejection destination of the transfer paper after the toner is fixed onto the transfer paper, into a tray 115 and a conveyance unit 190 according to an operation mode of the digital copier 1.

(Conveyance Unit)

The conveyance unit 190 is configured as follows. The conveyance unit 190 is a unit for conveying the transfer paper onto which the toner is fixed in the image forming unit 100, to the post-processing apparatus 200 described below, and the transfer paper is conveyed by a transport roller 191.

(Paper Feeding Stage)

The paper feeding stages 140, 150, 160, and 170 are a paper feeding stage provided in the main body of the digital copier 1, and have approximately the same configuration. The paper feeding stage 180 is a deck paper feed tray that is capable of accumulating a large amount of transfer paper, compared to the paper feeding stages 140, 150, 160, and 170. The main body paper feeding stages 140, 150, 160, and 170 have approximately the same configuration, and thus, only the configuration of the paper feeding stage 140 will be described. A base plate 142, which is moved up and down by a lift-up motor 143, is disposed on a bottom surface of a cassette 141 storing the transfer paper. The base plate 142 is moved up, and thus, the transfer paper stored in the cassette 141 is capable of waiting for the transfer paper at a predetermined height. The transfer paper which waits for the transfer paper at a predetermined height, is transported to a paper feeding roller pair 145 by a pickup roller 144. Torque is applied to the paper feeding roller pair 145 in a reverse rotation direction of the transfer paper, and thus, the transfer paper is fed to a transport path one by one while preventing overlap feeding of the transfer paper. In addition, a conveyance roller 146 is a roller pair further conveying the transfer paper, which has been conveyed from any one of the paper feeding stages 150, 160, and 170 positioned in a lower portion from the paper feeding stage 140, to an upper portion. The paper feeding stages 150, 160, and 170 include cassettes 151, 161, and 171, base plates 152, 162, and 172, lift-up motors 153, 163, and 173, pickup rollers 154, 164, and 174, paper feeding roller pairs 155, 165, and 175, respectively.

The paper feeding stage 180 is configured as follows. The paper feeding stage 180 includes a sheet magazine 181 storing the transfer paper, and a base plate 182, which moves up the transfer paper to a standby position, is also disposed on a bottom surface of the sheet magazine 181. The base plate 182 is connected to a belt, which is rotated by a motor 183, and the belt is moved, and thus, the up and down of the base plate 182 is controlled. The transfer paper in the standby position is conveyed to a paper feeding roller pair 184 by a pickup roller 185, and the paper feeding roller pair 184 feeds the transfer paper to the conveyance path one by one while preventing the overlap feeding of the transfer paper as with the paper feeding roller pairs 145, 155, 165, and 175.

(Post-Processing Apparatus)

The post-processing apparatus 200 is configured as follows. A roller 201 loads the transfer paper, which has been conveyed from the image forming unit 100, into the post-processing apparatus 200. In a case when a tray 204 is selected as an output destination of the loaded transfer paper, a conveyance direction is switched by a flapper 205, and the transfer paper is ejected to the tray 204 by a roller 202. The tray 204 is a tray, which is temporarily used, such as being used for the output of the transfer paper which is subjected to interrupt printing. A tray used for ejection of the transfer paper which is subjected to usual printing is a tray 210 and a tray 211. The conveyance direction of the transfer paper is switched to the lower portion by the flapper 205, and then, the conveyance direction of the transfer paper is switched to a direction of a roller 208 by a flapper 203, and thus, the transfer paper is output to the trays 210 and 211. In a case when the conveyance direction of the transfer paper is switched to a direction of a reverse roller 207 by a flapper 206, the conveyance direction of the transfer paper conveyed to the position of the reverse roller 207 is changed to a reverse direction by the reverse roller 207. In this case, the transfer paper is reversed and is ejected to the trays 210 and 211. In a case when the transfer paper is ejected to the trays 210 and 211, the digital copier 1 of this embodiment is capable of performing stapling processing by using a stapler 216. In addition, the digital copier 1 moves the trays 210 and 211 up and down by using a shift motor 212, and thus, the output destination of the transfer paper can be selectively switched. A tray 219 is an ejection tray which is used in a case when a plurality of transfer papers are bound and are output. In a case when the transfer paper is ejected to the tray 219, the transfer paper is conveyed from a roller 213 to a roller 214, and then, is transported to a primary accumulation unit 215. A predetermined number of transfer papers is accumulated in the primary accumulation unit 215, and then, the plurality of transfer papers are subjected to binding processing by the stapler 216. In a case when the binding processing is ended, the conveyance direction of the transfer paper derived by a flapper 217 is switched, and then, the roller 214 is rotated in a reverse direction from a case when the transfer paper is accumulated. After that, the transfer paper is ejected to the tray 219 through a roller 218.

Embodiment 1

Figure 4:
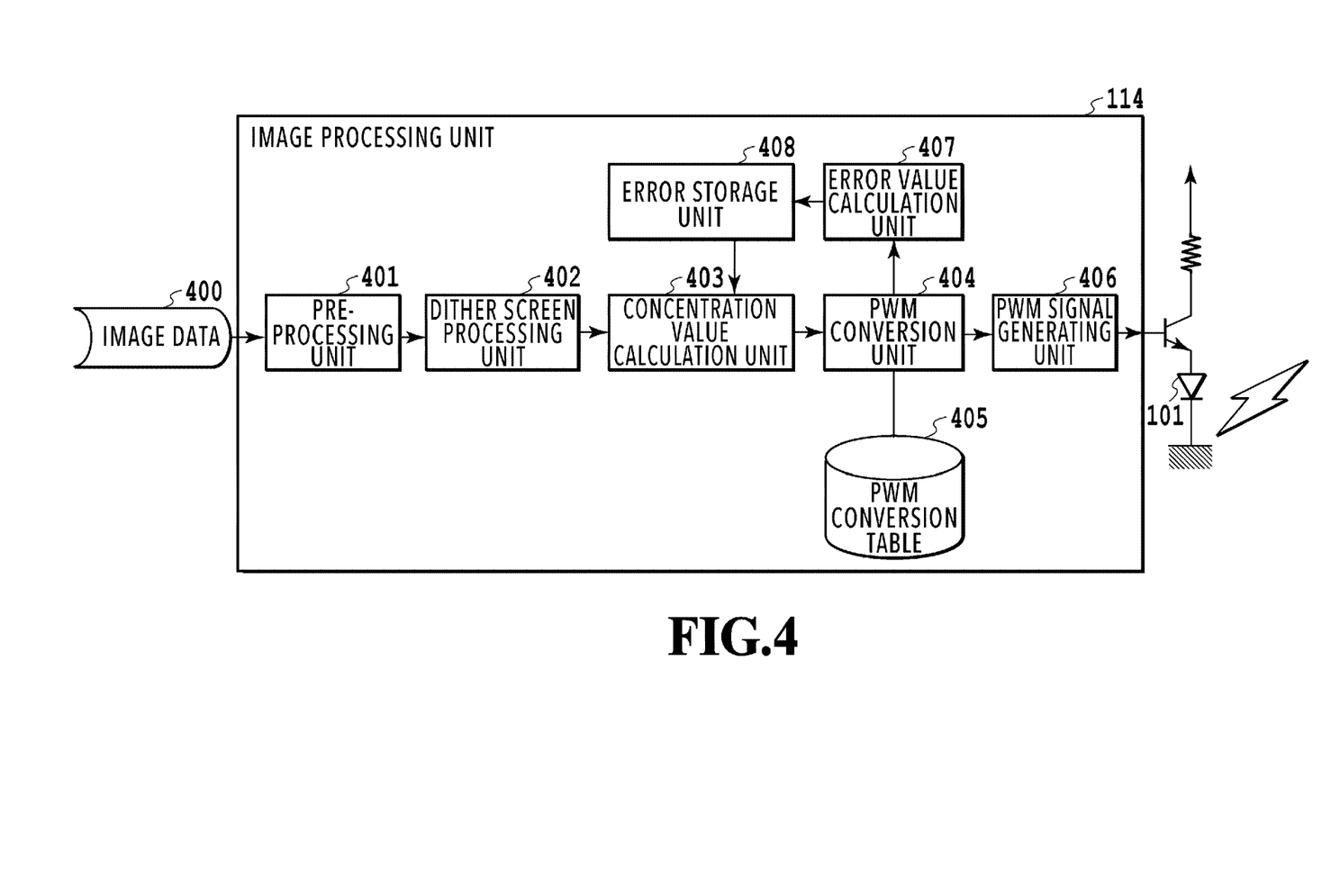
FIG. 4 is a block diagram illustrating an example of a functional configuration of an image processing unit of Embodiment 1.
Figure 5:
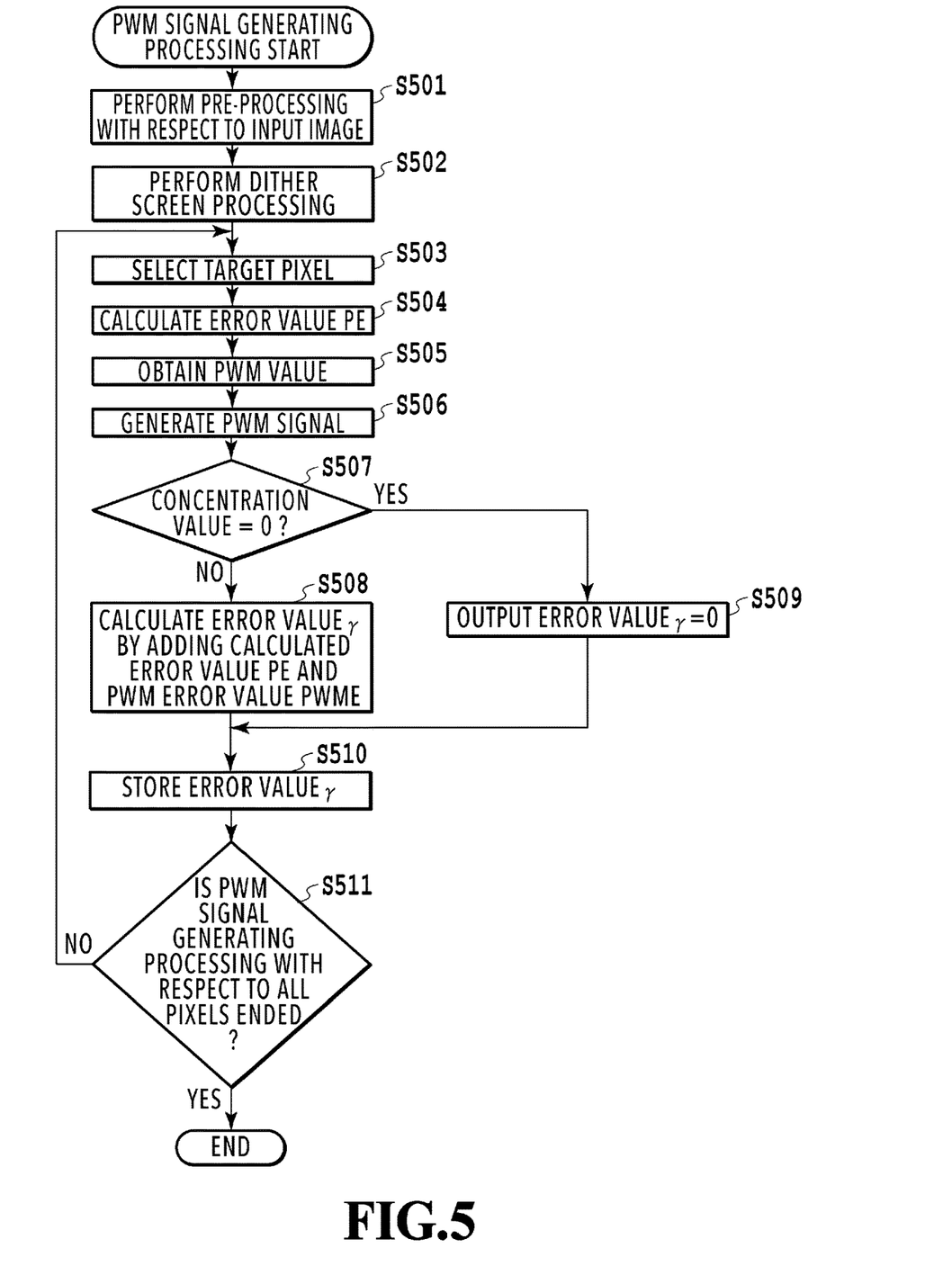
FIG. 5 is an example of a flowchart illustrating a processing procedure of the image processing unit of Embodiment 1.

FIG. 4 is a block diagram illustrating a functional configuration of an image processing unit 114 of this embodiment. FIG. 5 is a flowchart illustrating a processing procedure of generating a PWM signal in this embodiment. The processing of the flowchart illustrated in FIG. 5 is executed by an ASIC, or the like, realizing the image processing unit 114. Furthermore, each symbol S described below indicates a step in the flowchart. Hereafter, the generating processing of the PWM signal in this embodiment will be described with reference to the function block diagram of FIG. 4 and the flowchart of FIG. 5.

In S501, a pre-processing unit 401 performs pre-processing such as color space conversion processing, γ correction processing, and filter processing, with respect to the input image data 400 input to the image processing unit 114. The input image data of this embodiment, for example, is RGB image data of 8 bits.

In S502, a dither screen processing unit 402 performs dither screen processing with respect to the image data subjected to the pre-processing in S501. The dither screen processing, as described above, indicates processing of performing quantization such that a predetermined screen angle is generated. As a result of the dither screen processing, the image processing unit 114 is capable of obtaining the quantized image data. In this embodiment, an image represented by the image data quantized in S502 will be described as the screen image 20 illustrated in FIG. 2.

In S503, the image processing unit 114 selects a target pixel which is an object of generating a PWM signal.

Figure 6:
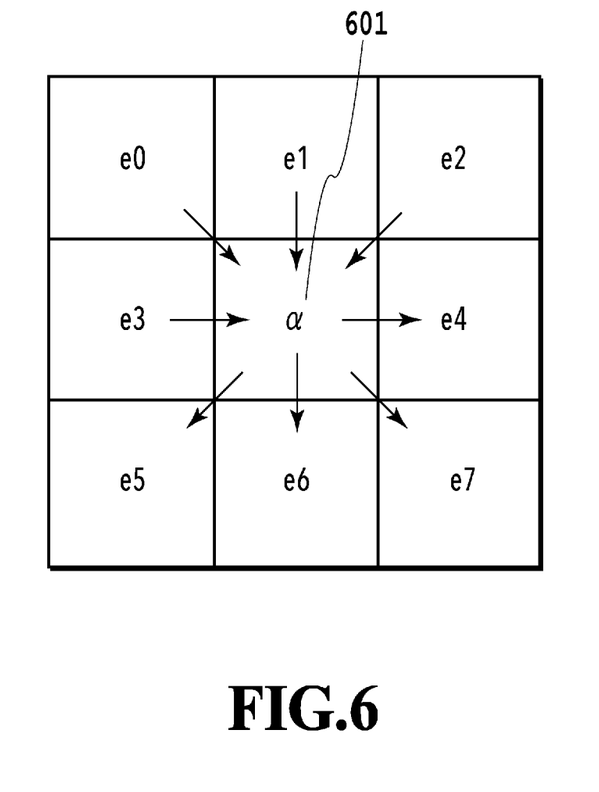
FIG. 6 is a schematic view illustrating a delivery method of an error value from peripheral pixels to a target pixel in Embodiment 1.

In S504, a concentration value calculation unit 403 calculates the error value in the target pixel. In this embodiment, FIG. 6 is a schematic view illustrating a delivery method of an error value from peripheral pixels e0 to e3 to a target pixel 601. The concentration value calculation unit 403 adds the error value in the peripheral pixels e0 to e3 to an input concentration value a of the target pixel 601 at a predetermined ratio. Further, the concentration value calculation unit 403 adds the calculated error value calculated in the target pixel 601 to peripheral pixels e4 to e7.

In the schematic view of FIG. 6, a concentration value B of the target pixel 601 after the error value of the peripheral pixels e0 to e3 is added is calculated by Expression (1) described below.

$$B = \alpha + e0 \times \kappa 0 + e1 \times \kappa 1 + e2 \times \kappa 2 + e3 \times \kappa 3 \quad \text{Expression (1)}$$

In Expression (1), κ0 to κ3 are a coefficient, and for example κ0=0.2, κ1=0.3, κ2=0.2, and κ3=0.3 are respectively set to a coefficient.

Then, in a case when an integer portion of the concentration value B is set to β, the calculated error value Pixel Error (hereinafter, referred to as "PE") in the target pixel 601 is represented by $$PE=B-\beta \qquad \text{Expression (2).}$$

Figure 7:
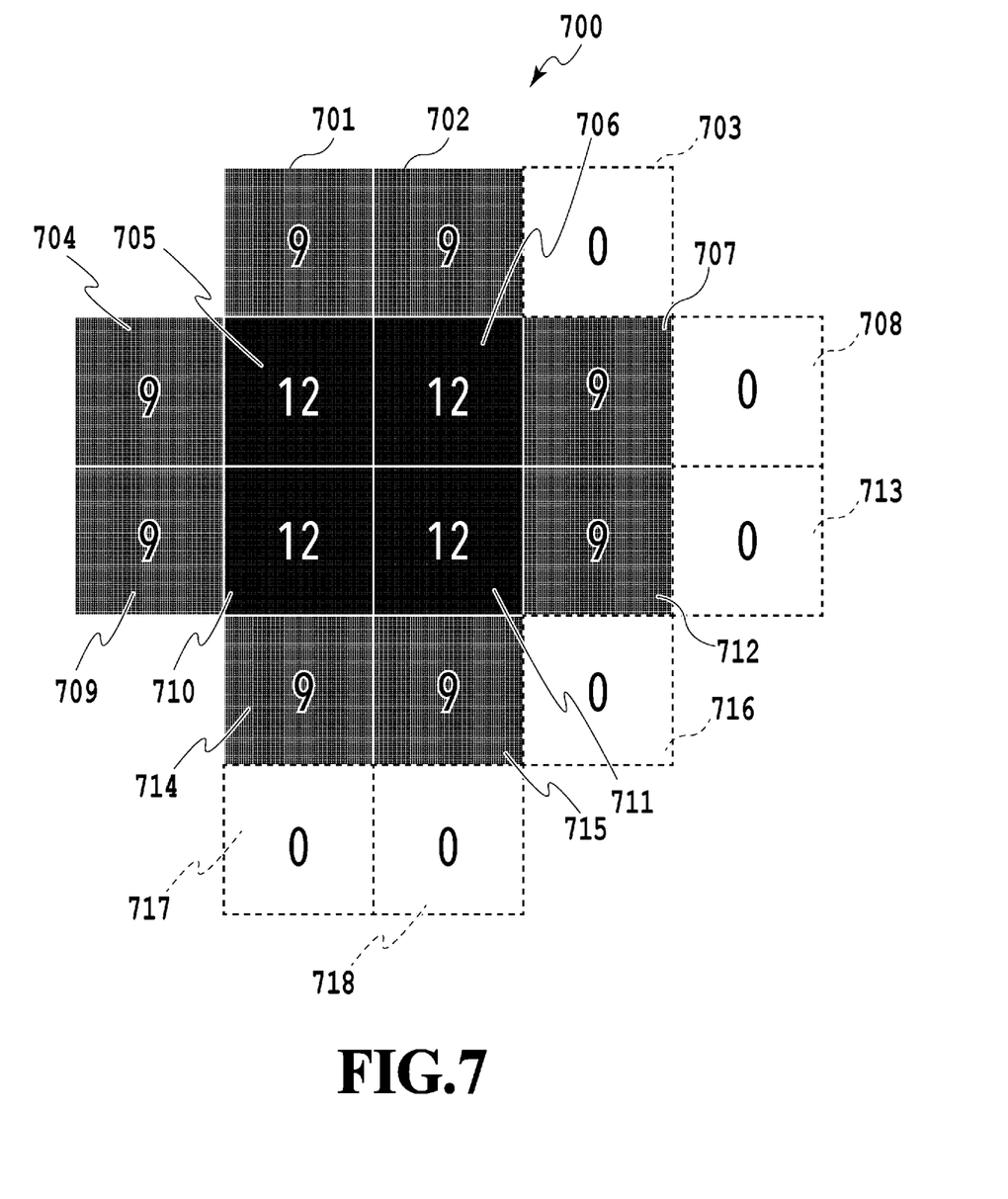
FIG. 7 is an enlarged view of a screen dot group in Embodiment 1.

Here, a specific example of the error value calculation using Expressions (1) and (2) will be described with reference to FIG. 7. FIG. 7 is an enlarged view of a screen dot group of this embodiment. For the sake of the convenience of the description, a concentration value of each pixel in the screen dot group of FIG. 7 is different from that of the screen dot group of FIG. 2. Specifically, the specific example of the error value calculation will be described such that a concentration value of a black pixel is 12 (Pulse Width of PWM Signal=27/40), and a concentration value of a gray pixel is 9 (Pulse Width of PWM Signal=22/40).

In a case when a pixel 701 is set to a target pixel, a concentration value of the pixel 701 is 9, and thus, values input into Expression (1) are α=9, e0=0, e1=0, e2=0, and e3=0, respectively. As a result thereof, the concentration value calculation unit 403 is capable of calculating $B_{701}=9$, $\beta_{701}=9$, and $PE_{701}=0$, with respect to the pixel 701.

In S505, a PWM conversion unit 404 obtains a PWM value corresponding to the concentration value β with reference to a PWM conversion table 405.

Figure 8:
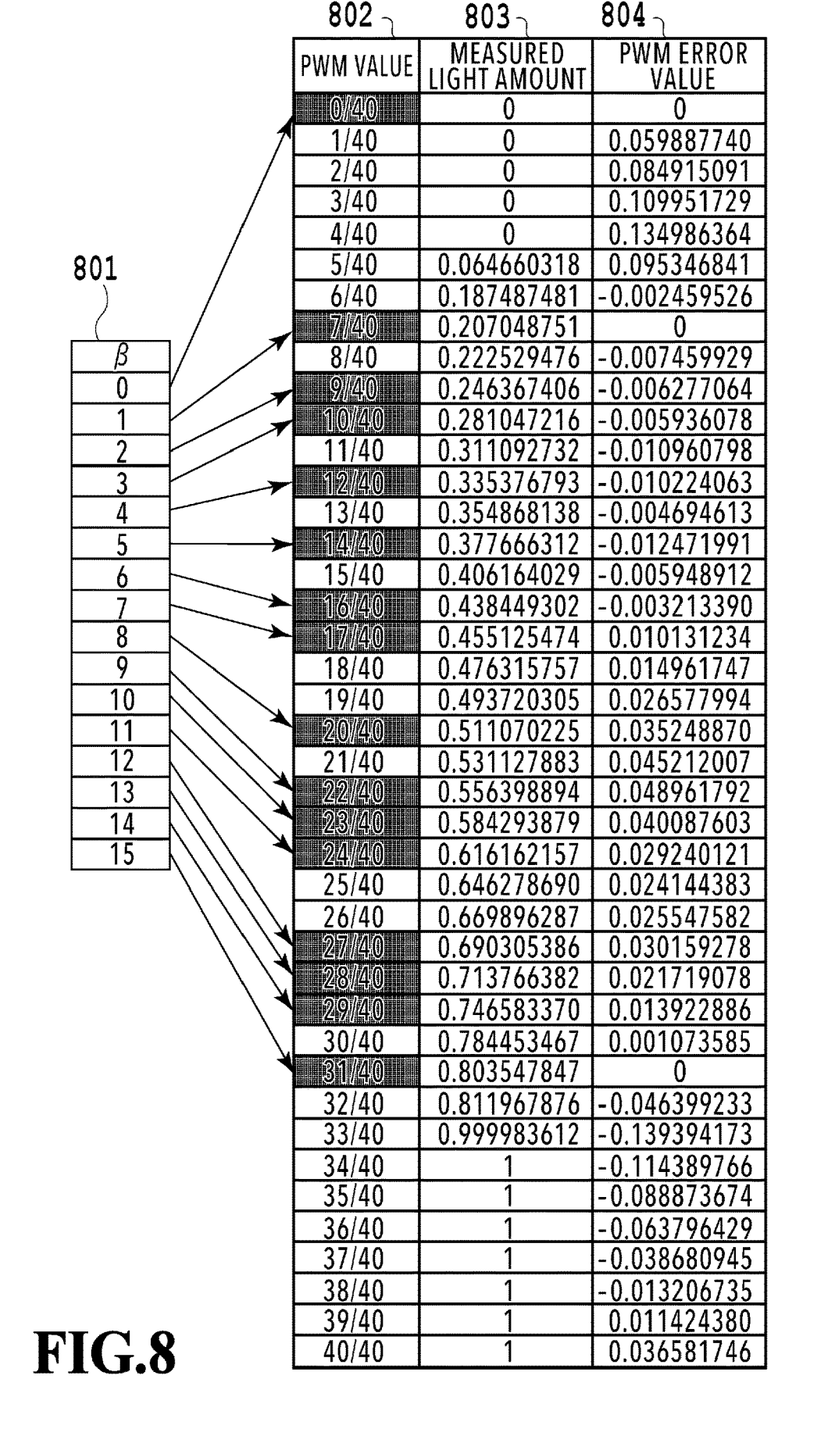
FIG. 8 is a diagram illustrating an example of a PWM conversion table in Embodiment 1.

FIG. 8 is a diagram illustrating an example of the PWM conversion table 405 of this embodiment. In the PWM conversion table 405 of FIG. 8, β, that is, a concentration value of a 16-gradation of 0 to 15 is stored in a concentration value column 801. A PWM value of 0/40 to 40/40 is stored in a PWM value column 802. In this embodiment, the PWM value is a value for determining a pulse width of a PWM signal (a pulse width of which a width is changed in predetermined unit (for example, 1/40)), and a PWM signal generating unit 406 described below determines the pulse width of the PWM signal on the basis of the PWM value. A measured light amount corresponding to the PWM value is stored in a measured light amount column 803. A light amount measured in a case when the laser 101 is emitted on the basis of the pulse width of 0/40 to 40/40 of the PWM signal, is stored in each cell of the measured light amount column 803. A value obtained by sampling in advance the measured light amount in a case where the laser 101 is actually emitted, is stored as the value of the measured light amount stored in the measured light amount column 803. In this embodiment, normalization is performed such that a minimum value of the measured light amounts is 0, and a maximum value is 1. An ideal value (FIG. 1A) in a case when a correspondence relationship between the pulse width of the PWM signal and the laser light amount is completely linear, and an error value converted from an error with respect to the measured light amount (hereinafter, referred to as a "PWM error value") are stored in a PWM error column 804.

Figure 9:
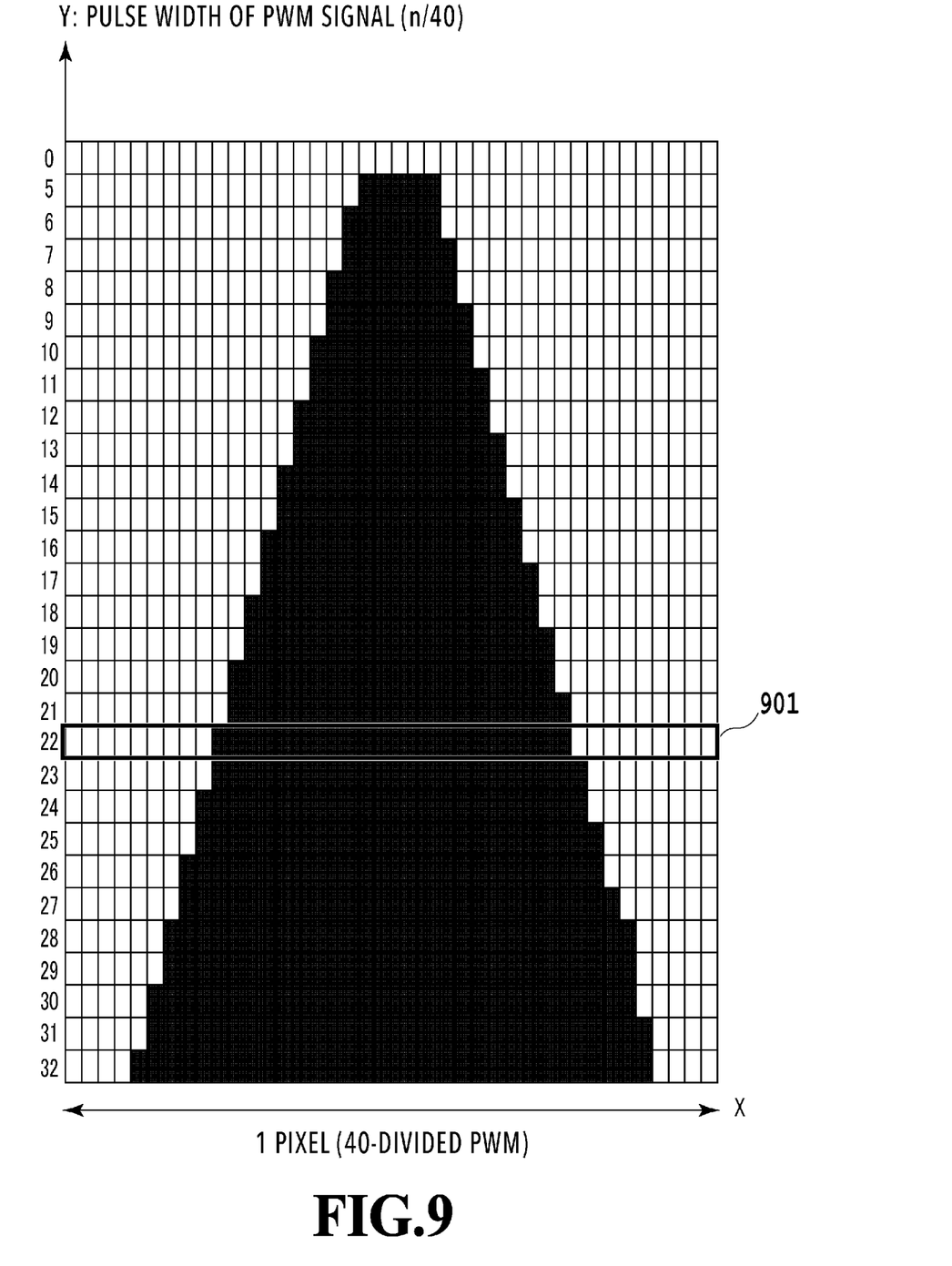
FIG. 9 is a diagram illustrating an example of an output pattern of a PWM signal in Embodiment 1.

FIG. 9 is a graph illustrating an example of an output pattern of the PWM signal in this embodiment. In the graph of FIG. 9, a vertical axis (a Y axis) indicates the pulse width of the PWM signal, and a horizontal axis (an X axis) indicates a width of one pixel which is divided into 40. In the Y axis, the pulse width of the PWM signal indicates a range of 5/40 to 32/40 in which On/Off of the light emitting source can be switched. In the X axis, a white region indicates that the PWM signal is turned off, and a black region indicates that the PWM signal is turned on. Furthermore, the graph of FIG. 9 is an example, and the X axis lengthens and resolution power of the PWM signal is also improved as a division number of one pixel increases. For example, in a case when the concentration value β indicates "9", a PWM value of "22/40" is obtained from the concentration value β with reference to the PWM conversion table 405 (FIG. 8). Then, the obtained PWM value of "22/40" is transmitted to the PWM signal generating unit 406. The PWM signal generating unit 406 outputs the PWM signal indicating a pattern 901, on the basis of the PWM value of "22/40". Specifically, a signal of 40 bits of "0000000001111111111111111-11111000000000" is output.

In S506, the PWM signal generating unit 406 outputs the PWM signal to the laser 101. In this embodiment, the PWM signal generating unit 406 sequentially outputs a signal of 40 bits representing the PWM pattern 901 to the scanning direction of the photoconductor drum 107 one bit by one bit, and thus, it is possible to control the irradiation of the laser 101. In a case when the PWM signal is generated with respect to the target pixel, and the irradiation from the laser 101 is controlled, the process proceeds to S507.

In S507, an error value calculation unit 407 determines the concentration value of the target pixel selected in S503. In this embodiment, the error value calculation unit 407 determines whether or not the input concentration value α in the target pixel is zero. In a case when the concentration value of the target pixel is 0 (S507: YES), the process proceeds to S509. In a case when the concentration value of the target pixel is other than zero, the process proceeds to S508. In the example of FIG. 7, the input concentration value α in the target pixel 701 is "9", and thus, the process proceeds to S508.

In another embodiment, it may be determined whether or not the concentration value B of the target pixel after the error value calculated in the peripheral pixels is added, is less than 1. In addition, the concentration value, which is a determination standard, is not necessarily limited to "Concentration Value B=Less than 1", and in a case when the concentration value of the target pixel is less than a predetermined value, it may be controlled such that the process proceeds to S509. The standard for determining the concentration value is set as described above, and thus, for example, even in a case of a screen image where a screen dot group is periodically dotted in a solid image of a low concentration value, the diffusion of the error value is limited to a predetermined range, and thus, it is possible to suppress the occurrence of moire or the like in the output image.

In S508, the error value calculation unit 407 adds the calculated error value PE calculated in S504, and the PWM error value corresponding to the PWM value selected in S505. The PWM error value is obtained with reference to the PWM conversion table 405 described above. In the examples of FIG. 7 and FIG. 8, the error value calculation unit 407 is capable of obtaining a PWM error value of "0.048961792" corresponding to a PWM value of "22/40" with reference to the PWM conversion table 405. Then, in a case when the PWM error value is set to PWME, an error value γ obtained by adding up the calculated error value PE in the target pixel and the PWM error value PWME, is $$\gamma_{701}=PE_{701}+PWME_{701}=0.048961792 \qquad \text{Expression (3).}$$

In S510, an error storage unit 408 stores the error value γ in the target pixel in a predetermined storage region (not illustrated) of the image forming unit 100.

On the other hand, in a case when the concentration value of the target pixel is 0 (S507: YES), in S509, clear processing of the error value γ is performed. For example, in the example of FIG. 7, in a case where a pixel 703 is the target pixel, each value of α=0, e0=0, e1=0, e2=0, and e3=$\gamma_{702}$ is calculated by using Expression (1) described above. As a result of the calculation using Expression (1), each value of $B_{703}$=0.019095099, $\beta_{703}$=0, $PE_{73}$=0.019095099, and $PWME_{703}$=0 can be obtained. Next, in S505, PWM Value=0/0 corresponding to β=0 is output, and then, in S507, it is determined that Input Concentration Value α in Target Pixel=0. Then, in S509, the error value calculation unit 407 outputs the value of the error value γ of "0". For example, in the example of FIG. 7, in a case when the pixel 703 is the target pixel, "0.019095099" in which $PE_{703}$=0.019095099 and $PWME_{703}$=0 are added up, is originally calculated as $\gamma_{703}$. However, in S509, as a result of clearing the added value of "0.019095099" to 0, "0" is output as the error value γ. In this case, in S510, the error storage unit 408 stores Error Value γ in Target Pixel=0 in a predetermined storage region (not illustrated) of the image forming unit 100.

In S511, the image processing unit 114 determines whether or not PWM signal generating processing with respect to all pixels configuring the input image data is ended. In a case where the PWM signal generating processing with respect to all of the pixels is ended (S511: YES), the processing of this flowchart is ended.

On the other hand, in a case when the PWM signal generating processing with respect to all of the pixels is not ended (S511: NO), the process returns again to S503, the next target pixel is selected (S503), and the processings after S504 are repeated. In the example of FIG. 7, the pixel 702 is selected as the target pixel (S503), the calculated error value PE with respect to the pixel 702 is obtained (S504). In this case, values input into Expression (1) are α=9, e0=0, e1=0, e2=0, and e3=$\gamma_{701}$=0.048961792, respectively. As a result thereof, the concentration value calculation unit 403 is capable of obtaining $B_{702}$=9.014688538, $\beta_{702}$=9, and $PE_{702}$=0.014688538 with respect to the pixel 702 from Expression (2). Hereinafter, as with a case where the pixel 701 is selected as the target pixel, the error value γ is calculated with respect to the pixel 702. In the example of FIG. 7, finally, $PME_{702}$=0.048961792 and $\gamma_{702}$=$PE_{702}$+$PWME_{702}$=0.06365033 are calculated.

Likewise, S503 to S511 are repeated with respect to pixels after a pixel 704, and thus, it is possible to calculate the error value γ corresponding to each of the pixels. In the example of the example of FIG. 7, specific examples of α, e0 to e3, B, β, PE, PWME, and γ corresponding to each of the pixels 701 to 718 are shown in Table 1 described below.

In Table 1, 0, which is underlined, indicates a γ value cleared in S509.

As the technology of the related art, in a case when the clear processing of the error value γ is not performed in S509, in the example of FIG. 7, the error value γ is not 0 even in a case when the concentration value β of the pixels 703, 708, 713, 716, 717, and 718 is 0. For this reason, the error value γ calculated in the pixels 703, 708, 713, 716, 717, and 718 is propagated to a right direction, a lower right direction, a lower left direction, and a lower direction in the screen image. For example, in a screen dot group 700 of FIG. 7, the pixel of Concentration Value=9 is calculated as 8, and the pixel of Concentration Value=12 is calculated as 4. The sum of the PWM error values generated in the screen dot group 700 is 0.048961792×8+0.030159278×4=0.512331 . . . , with reference to the PWM conversion table 405. Thus, the sum of the PWM error values generated in the screen dot group 700 is 0.512331 . . . , and thus, the pulse width of the PWM signal corresponding to the pixels 701 to 718 is not changed before and after the error diffusion processing.

However, the PWM error value of 0.512331 . . . generated in the screen dot group 700 is hardly propagated to the adjacent screen dot group, and a predetermined error value is also generated even in the adjacent screen dot group. In the example of FIG. 7, in a case when a pixel configuration of the adjacent screen dot group is identical to that of the screen dot group 700, on the calculation, the sum of the PWM error values in two screen dot groups is greater than 1.0. For this reason, in two screen dot groups, it is necessary to correct a concentration value of any pixel configuring any screen dot group. According to the correction of the concentration value due to a difference in the PWM error values, a screen dot groups having different sums of the concentration values are alternately generated one by one. As a result thereof, there is a possibility that undesirable visual effect such as moire occurs in the output image. In addition, in a case when the input image data is image data representing a gradation image, gradation properties of an output concentration indicated by a plurality of screen dot groups are degraded, and thus, there is also a possibility that pseudo contour occurs in the output image.

In the error diffusion processing of the PWM error value of this embodiment, it is determined whether or not the output of the error value of the target pixel is cleared according to the concentration value in the target pixel. For this reason, a PWM error value generated in a certain screen

TABLE 1

|  | α | e0 | e1 | e2 | e3 | E | β | PE | PWME | γ |
|---|---|---|---|---|---|---|---|---|---|---|
| Pixel 701 | 9 | 0 | 0 | 0 | 0 | 9 | 9 | 0 | 0.048961792 | 0.048961792 |
| Pixel 702 | 9 | 0 | 0 | 0 | 0.048961792 | 9.014688538 | 9 | 0.014688538 | 0.048961792 | 0.063650330 |
| Pixel 703 | 0 | 0 | 0 | 0 | 0.063650330 | 0.019095099 | 0 | 0.019095099 | 0 | <u>0</u> |
| Pixel 704 | 9 | 0 | 0 | 0.048961792 | 0 | 9.009792358 | 9 | 0.009792358 | 0.048961792 | 0.058754150 |
| Pixel 705 | 12 | 0 | 0.048961792 | 0.063650330 | 0.058754150 | 12.045044849 | 12 | 0.045044849 | 0.030159278 | 0.075204127 |
| Pixel 706 | 12 | 0.048961792 | 0.063650330 | 0 | 0.075204127 | 12.051448695 | 12 | 0.051448695 | 0.030159278 | 0.081607973 |
| Pixel 707 | 9 | 0.063650330 | 0 | 0 | 0.081607973 | 9.037212458 | 9 | 0.037212458 | 0.048961792 | 0.086174250 |
| Pixel 708 | 0 | 0 | 0 | 0 | 0.086174250 | 0.025852275 | 0 | 0.025852275 | 0 | <u>0</u> |
| Pixel 709 | 9 | 0 | 0.058754150 | 0.075204127 | 0 | 9.032667070 | 9 | 0.032667070 | 0.048961792 | 0.081628862 |
| Pixel 710 | 12 | 0.058754150 | 0.075204127 | 0.081607973 | 0.081528862 | 12.075122321 | 12 | 0.075122321 | 0.030159278 | 0.105281599 |
| Pixel 711 | 12 | 0.075204127 | 0.081607973 | 0.086174250 | 0.105281599 | 12.088342547 | 12 | 0.088342547 | 0.030159278 | 0.118501825 |
| Pixel 712 | 9 | 0.081607973 | 0.086174250 | 0 | 0.118501825 | 9.077724417 | 9 | 0.077724417 | 0.048961792 | 0.126686209 |
| Pixel 713 | 0 | 0.086174250 | 0 | 0 | 0.126686209 | 0.055240713 | 0 | 0.055240713 | 0 | <u>0</u> |
| Pixel 714 | 9 | 0.081628862 | 0.105261599 | 0.118501825 | 0 | 9.071610617 | 9 | 0.071610617 | 0.048961792 | 0.120572409 |
| Pixel 715 | 9 | 0.105281599 | 0.118501825 | 0.126686209 | 0.120572409 | 9.118115832 | 9 | 0.118115832 | 0.048961792 | 0.167077624 |
| Pixel 716 | 0 | 0.118501825 | 0.126686209 | 0 | 0.167077624 | 0.111829515 | 0 | 0.111829515 | 0 | <u>0</u> |
| Pixel 717 | 0 | 0 | 0.120572409 | 0.167077624 | 0 | 0.069587245 | 0 | 0.069587248 | 0 | <u>0</u> |
| Pixel 718 | 0 | 0.120572409 | 0.167077624 | 0 | 0 | 0.074237769 | 0 | 0.074237769 | 0 | <u>0</u> | dot group is prevented from being propagated to the other screen dot group. As a result thereof, it is possible to suppress the occurrence of moire, pseudo contour, or the like, in the output image, and to obtain an output image of a high image quality.

Embodiment 2

In the error calculation processing of Embodiment 1, on the basis of whether or not the input concentration value α in the target pixel is 0, it is determined whether or not the error value γ is cleared (S507 and S509). In contrast, in error calculation processing of this embodiment, it is determined whether or not the error value γ is cleared on the basis of whether or not the target pixel is positioned on a boundary of a region including the screen dot group (hereinafter, referred to as a "screen region"). Hereafter, the details of determination processing of whether or not the target pixel is positioned in the boundary of the screen region will be described with reference to FIG. 10. Furthermore, the description of the parts common to Embodiment 1 will be simplified or omitted, and hereinafter, the characteristics of this embodiment will be mainly described.

Figure 10:
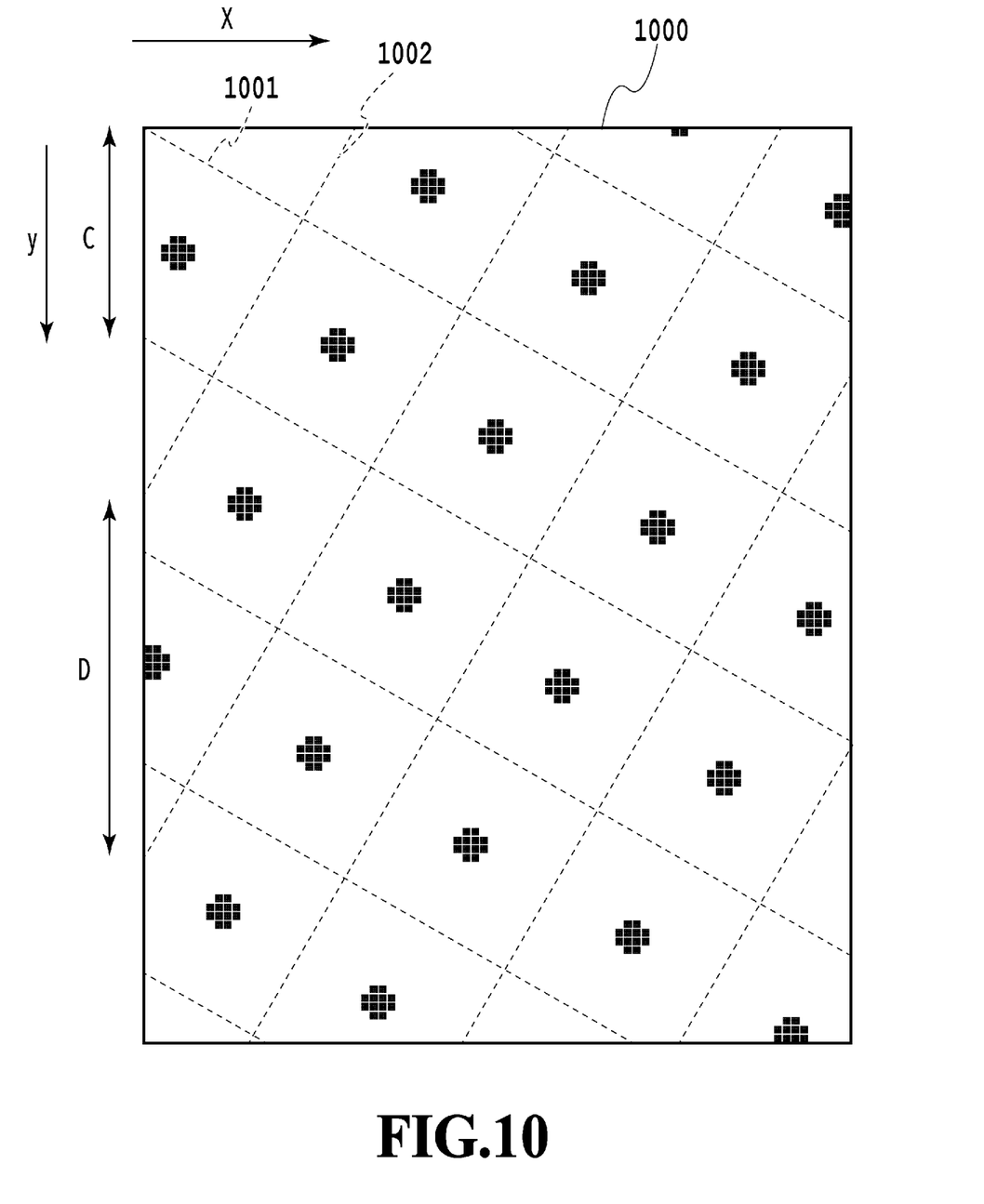
FIG. 10 is a diagram illustrating an example of a screen image in Embodiment 2.

FIG. 10 is a diagram schematically illustrating a screen image 1000 having a screen angle of 30° and definition of 1200 dpi, as an example. In FIG. 10, x represents a main scanning direction, and y represents a sub-scanning direction. In the screen image 1000 of FIG. 10, a boundary 1001 can be represented by the following expression focusing on the boundary 1001 between the screen regions.

$$y=\tan(30°)*x+24*n \qquad \text{Expression (4)}$$

In Expression (4), x and y represent coordinate values (x, y) of the target pixel, and tan(30°) is specified from the screen angle, and a numerical value of "24" is specified from a width C of the screen region (that is, the number of screen lines). In addition, the screen regions of the same shape are repeated, and thus, an integer of 0, 1, 2, . . . is input into a variable of "n".

On the other hand, in the screen image 1000 of FIG. 10, a boundary 1002 can be represented by the following expression focusing on the boundary 1002 between the screen regions.

$$y=\tan(60°)*x+42*m \qquad \text{Expression (5)}$$

In Expression (5), x and y represent coordinate values (x, y) of the target pixel, respectively, tan(60°) is specified from the screen angle, and a numerical value of "42" is specified from a width D of the screen region. In addition, as with Expression (4), an integer of 0, 1, 2, . . . is input into a variable of "m".

In the determination processing (S507) of the target pixel in this embodiment, it is determined whether or not any one of Expressions (6) and (7) is established.

$$0<y=\tan(30°)*x+24*n \leq 1 \qquad \text{Expression (6)}$$

$$0<y=\tan(60°)*x+42*m \leq 1 \qquad \text{Expression (7)}$$

That is, in this embodiment, the error value calculation unit 407 determines whether or not the target pixel is positioned on the boundary of the screen region in the screen image 1000. In a case where any one of Expressions (6) and (7) is established, it is determined that the target pixel is positioned on the boundary of the screen region (S507: YES). In this case, the process proceeds to S509, and the error value γ is cleared to 0. In a case when any one of Expressions (6) and (7) is not established, it is determined that the target pixel is not positioned on the boundary of the screen region (S507: NO). In this case, the process proceeds to S508, the error value γ is output in which the calculated error value PE and the PWM error value are added up. The subsequent processings are identical to those of Embodiment 1, and thus, the description will be omitted.

Thus, in the error calculation processing of this embodiment, in a case where the target pixel is positioned on the boundary of the screen region, the error value corresponding to the target pixel is cleared to zero. For this reason, for example, even in a case when the concentration of the screen image is high, and the screen dot group is connected to the dot group in the adjacent region, the error value γ is automatically cleared on the boundary of the screen region, and thus, the concentration of the screen unit is maintained to be constant.

OTHER EMBODIMENTS

Embodiment(s) of the present invention can also be realized by a computer of a system or an apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., an application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., a central processing unit (CPU), a micro processing unit (MPU)) and may include a network of separate computers or separate processors to read out and to execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), a digital versatile disc (DVD), or a Blu-ray Disc (BD)™), a flash memory device, a memory card, and the like.

According to the image processing apparatus of the invention, it is possible to suppress the occurrence of moire, pseudo contour, or the like, in the output image, and to obtain an output image of a high image quality.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. An image processing apparatus for generating a screen image, the image processing apparatus comprising:
   (A) a dither processing unit configured to perform dither processing on first image data to generate second image data, the generated second image data including a target pixel and an adjacent pixel, each of the target pixel and the adjacent pixel having a density value, the density value of the target pixel being greater than that of the adjacent pixel, and the density value of the adjacent pixel being not greater than a predetermined density;

(B) a diffusing unit configured (a) to determine an error value resulting at the target pixel, the error value being based on a difference between (i) a light amount of laser light emitted on the basis of the density value of the target pixel, and (ii) a target light amount corresponding to the density value, with respect to the target pixel, and (b) to diffuse the error value to pixels subsequent to the target pixel, the adjacent pixel being included in the pixels subsequent to the target pixel, wherein the diffusing unit is configured not to diffuse an error value resulting at the adjacent pixel to pixels subsequent to the adjacent pixel; and (C) an obtaining unit configured to obtain (a) a pulse width of the target pixel based on the density value of the target pixel and (b) a pulse width of the adjacent pixel based on (i) the density value of the adjacent pixel and (ii) an error value diffused by the adjacent pixel, wherein the pulse width of the target pixel and the pulse width of the adjacent pixel are used to generate signals to output the screen image.

2. The image processing apparatus according to claim 1, wherein the density value of the target pixel is not zero and the density value of the adjacent pixel is zero.

3. The image processing apparatus according to claim 1, further comprising a determination unit configured (i) to determine whether a pixel of the generated second image data is one of a black pixel, a gray pixel, and a white pixel, and (ii) to provide this determination to said diffusing unit, and wherein the target pixel is one of a black pixel and a gray pixel, and the adjacent pixel is a white pixel.

4. An image processing method for generating a screen image, the image processing method comprising:

(A) performing dither processing on first image data to generate second image data, the generated second image data including a target pixel and an adjacent pixel, each of the target pixel and the adjacent pixel having a density value, the density value of the target pixel being greater than that of the adjacent pixel, and the density value of the adjacent pixel being not greater than a predetermined density;

(B) determining an error value resulting at the target pixel, the error value being based on a difference between (i) a light amount of laser light emitted on the basis of a pixel value of the target pixel, and (ii) a target light amount corresponding to the pixel value, with respect to the target pixel;

(C) diffusing the error value to pixels subsequent to the target pixel, the adjacent pixel being included in the pixels subsequent to the target pixel, wherein the diffusing is configured not to diffuse an error value resulting at the adjacent pixel to pixels subsequent to the adjacent pixel; and (D) obtaining (a) a pulse width of the target pixel based on the density value of the target pixel and (b) a pulse width of the adjacent pixel based on (i) the density value of the adjacent pixel and (ii) an error value diffused by the adjacent pixel, wherein the pulse width of the target pixel and the pulse width of the adjacent pixel are used to generate signals to output the screen image.

5. The image processing method according to claim 4, wherein the density value of the target pixel is not zero and the density value of the adjacent pixel is zero.

6. The image processing method according to claim 4, further comprising (i) determining whether a pixel of the generated second image data is one of a black pixel, a gray pixel, and a white pixel, and (ii) using this determination in the diffusing step, wherein the target pixel is one of a black pixel and a gray pixel, and the adjacent pixel is a white pixel.

7. A non-transitory computer readable storage medium storing a program for causing a computer to function as an image processing apparatus for generating a screen image, wherein the image processing apparatus comprises:

(A) a dither processing unit configured to perform dither processing on first image data to generate second image data, the generated second image data including a target pixel and an adjacent pixel, each of the target pixel and the adjacent pixel having a density value, the density value of the target pixel being greater than that of the adjacent pixel, and the density value of the adjacent pixel being not greater than a predetermined density (B) a diffusing unit configured (a) to determine an error value resulting at the target pixel, the error value being based on a difference between (i) a light amount of laser light emitted on the basis of a pixel value of the target pixel, and (ii) a target light amount corresponding to the density value, with respect to the target pixel, and (b) to diffuse the error value to pixels subsequent to the target pixel, the adjacent pixel being included in the pixels subsequent to the target pixel, wherein the diffusing unit is configured not to diffuse an error value resulting at the adjacent pixel to pixels subsequent to the adjacent pixel; and (C) an obtaining unit configured to obtain (a) a pulse width of the target pixel, and (b) a pulse width of the adjacent pixel based on (i) the density value of the adjacent pixel and (ii) an error value diffused by the adjacent pixel, wherein the pulse width of the target pixel and the pulse width of the adjacent pixel are used to generate signals to output the screen image.

8. A non-transitory computer readable storage medium according to claim 7, wherein the density value of the target pixel is not zero and the density value of the adjacent pixel is zero.

9. A non-transitory computer readable storage medium according to claim 7, wherein the image processing apparatus further comprises a determination unit configured (i) to determine whether a pixel of the generated second image data is one of a black pixel, a gray pixel, and a white pixel, and (ii) to provide this determination to said diffusing unit, and wherein the target pixel is one of a black pixel and a gray pixel, and the adjacent pixel is a white pixel.

* * * * *